United States Patent [19]

Peterson

[11] Patent Number: 5,071,013

[45] Date of Patent: Dec. 10, 1991

[54] SELF-ALIGNING WEDGE CLAMP

[75] Inventor: Keven T. Peterson, Cedar Rapids, Iowa

[73] Assignee: Rockwell International Corporation, El Segundo, Calif.

[21] Appl. No.: 537,713

[22] Filed: Jun. 13, 1990

[51] Int. Cl.⁵ .............................................. H05K 7/00
[52] U.S. Cl. ........................................ 211/41; 24/525
[58] Field of Search ............... 248/231.2, 231.4, 225.1, 248/231.3, 316.2; 211/26, 40, 41; 24/524, 525; 361/388, 386, 415

[56] References Cited

U.S. PATENT DOCUMENTS

| 3,767,058 | 10/1973 | Barlow et al. ....................... 211/41 |
| 4,318,157 | 3/1982 | Rank et al. ..................... 361/388 X |
| 4,480,287 | 10/1984 | Jensen .................................. 361/388 |
| 4,819,713 | 4/1989 | Weisman ....................... 361/388 X |
| 4,821,147 | 4/1989 | Jacobs et al. ..................... 211/41 X |
| 4,909,752 | 3/1990 | Hallum et al. ................. 361/388 X |
| 4,953,059 | 8/1990 | McNulty ......................... 211/41 X |
| 4,971,570 | 11/1990 | Tolle et al. ..................... 361/388 X |

OTHER PUBLICATIONS

EG&G Birtcher Product Information "Self-Aligning Five-Piece Series 40-5 Wedge-Lok".
Calmark Corporation Product Information "Series 260-card-lok Retainer (cold plate)".

Primary Examiner—Karen J. Chotkowski
Attorney, Agent, or Firm—M. Lee Murrah; V. Lawrence Sewell; H. Fredrick Hamann

[57] ABSTRACT

A four directional self-aligning wedge clamp having a series of wedge elements is shown. A rod is centrally disposed through the series of elements of exert longitudinal forces thereto. A bracket pair is urged against the body of the device to be clamped while transverse forces are urged upon the wedge elements when the clamp is in its expanded state. When in its relaxed state, the clamp may be easily removed from the channels in which it is to be secured.

20 Claims, 3 Drawing Sheets

SELF-ALIGNING WEDGE CLAMP

BACKGROUND OF THE INVENTION

This invention relates to clamping mechanisms and in particular to clamp mechanisms for the attachment of electronic modules to racks used in industrial and military applications.

Numerous electronic control devices are typically carried aboard airplanes, large ships and in some military vehicles. The usual mounting for such devices is by rack mounting, wherein the individual electronic units are mounted side by side or in a vertical arrangement in an enclosure having means to provide mechanical moorings for the units. Older methods for installing such devices in the rack included the use of flanges mounted on the front face of the individual electronic units which could be bolted to flanges on the rack. Later devices provided clamping apparatus on the rack which captured a flange formed on the front of the individual units to retain the units to the rack.

With the establishment of standardized electronic module size specifications has come the need for channel engaging clamps for mechanical retention of the unit or module to the rack. In this type of arrangement, the rack is provided with channels extending into its enclosure on both the top and bottom.

In one apparatus from the prior art, wedge clamps having a series of wedge shaped elements and having a single screw passing therethrough have been utilized to mount printed circuit boards in a rack having a single channel. This form of existing wedge clamp, when relaxed, features a generally aligned series of wedges, each centrally mounted on a single screw and interacting with a wedge shaped element mounted to the printed circuit board to be mounted. The relaxed wedge clamp may be inserted into the channel of the rack. When in place, the screw is tightened, causing a shortening of the effective length of the clamp and a consequent transverse displacement of the wedges from their relaxed aligned position. This displacement causes a widening of the effective width of the clamp, thereby creating rigidity with the rack's channels. This type of simple wedge has been considered for use with encased standardized electronic modules. This type of two directional wedge clamp is satisfactory for mounting of low mass units which require a single wedge clamp on opposing sides of the modules but for those modules or units where additional clamps are required due to the increased widths of the units, a stack up of tolerance variations between the channels of the rack and the fixed element of the two directional wedge clamp renders the two directional clamp inoperable.

SUMMARY OF THE INVENTION

A wedge clamp for mounting modules to a rack is provided. The rack is provided with elongate channels extending thereinto for receiving edge mounted clamp members of modules to be positioned within the rack. The clamp is designed to provide not only the wedge disalignment clamping transverse to the channel in which the clamp will be fitted, but also to provide clamping in a second direction, that is, axial to the body of the clamped item. When an enclosed module needs to be secured, more than one clamp must be used to provide adequate vibration stability and heat transfer. The simple wedge clamp of the prior art has no provision for realignment to the module and when two or more of the wedge clamps are used side by side, tolerance buildup among the clamps and the channels causes ineffectiveness of the extra clamps.

One object of the invention is to provide an improved edge mounted clamp having displaceable wedges therein.

Another object of the invention is to provide a four directional wedge clamp.

Another object of the invention is to provide a self-aligning wedge clamp.

Another object of the invention is to provide a self-aligning wedge clamp having effective heat transfer capability.

These and other objects will become apparent upon reference to the description of the invention.

An elongate rib is provided upon the module which is to be mounted in the rack. The rib is formed with a passageway therein for receiving a tightening rod. An inclined recess is provided upon each end of the rib, with the greatest magnitude of recess proximal to the body of the module.

A pair of linked together bracket members is slidably receivable upon the module body proximate to the rib thereof. Each bracket member is substantially a mirror image of the other, with each having a longitudinally extending wall depending generally perpendicularly from the base thereof. Each bracket member is provided with a protruding region formed thereon which is receivable within one of the recesses of the rib member mounted to the module body, having at the opposing side of said region an angularly formed face which is slidably interactive with one of a pair of first wedge elements. Each first wedge element is a generally polyhedron having two pairs of parallel faces thereon and a pair of non-parallel faces. One of the pair of non-parallel faces of each first wedge element is engageable with the angularly formed face of a bracket member. A second wedge element is interactive with one of the bracket members through slidable engagement with the wall of the bracket member. The second wedge element engages one of the first wedge elements at the opposing non-parallel face thereof. A third wedge element generally similar in shape to the second wedge element is slidably interactive with the bracket member which is not interactive with the second wedge member.

A passageway is provided longitudinally through the protruding regions of each of the bracket members and through the wedge members whereby a passageway is communicative among those elements and the passageway of the rib member. An elongate rod is receivable within the passageways and freely slidable in all thereof except the second wedge element wherein a thread is provided within the passageway which is engageable with threads upon the rod.

While in its relaxed state, the invention may be freely passed into the channels of the rack. The bracket members are slidably displaceable upon the module to allow self-alignment of adjacent wedge clamps in neighboring channels of the rack.

When the rod is driven into the threads of the second wedge element, the interaction of the wedge elements with each other and the bracket creates an expansion of the invention thereby urging it against the sides of the rack channel. In addition, tightening of the threads of the rod effectuates displacement of the bracket in a second direction due to its interaction with the rib member, creating frictional engagement and tightening against the module wall in the second direction. Having become aligned while relaxed, the invention becomes stationary on the module when the invention is tightened to its expanded state.

DESCRIPTION OF THE DRAWING FIGURES

DETAILED DESCRIPTION OF THE INVENTION

Figure 1:
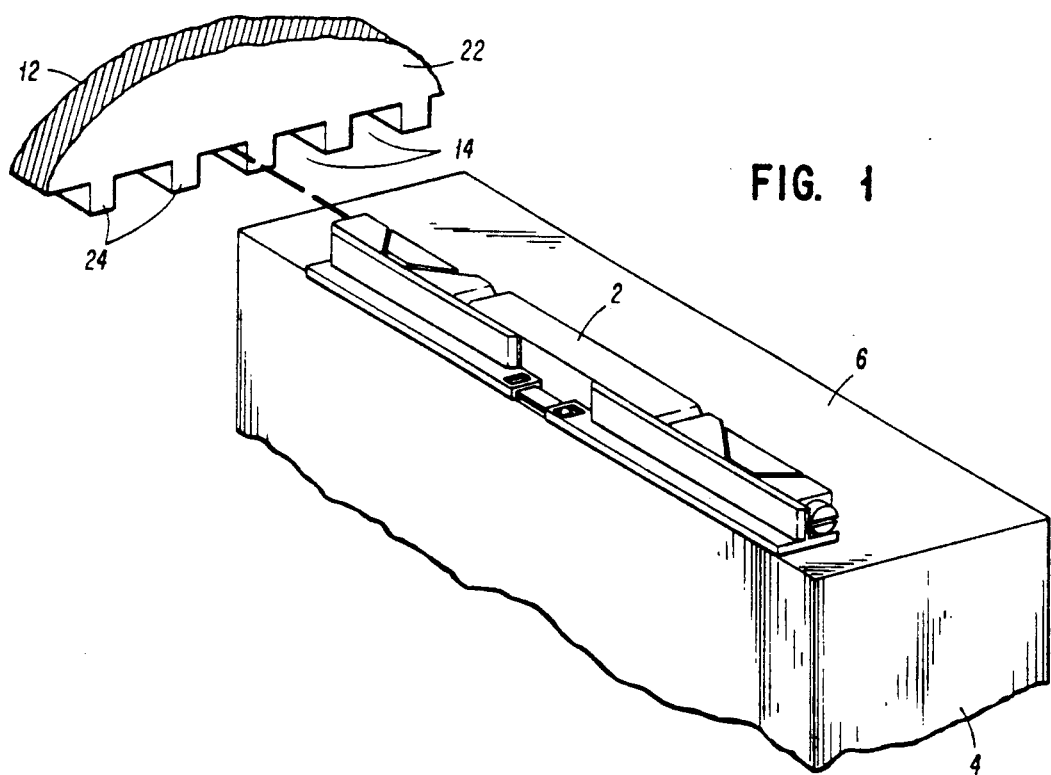
FIG. 1 is a perspective of the invention mounted to a module.

Referring to the figures, FIG. 1 discloses invention 2 mounted to a standard module 4 on a wall 6 thereof. Invention 2 is shown in its relaxed state in this figure. A cutaway portion of a rack 12 discloses channels 14 formed between rails 24. While in its relaxed state, the invention 2 may be freely passed into the channels 14 of the rack 12.

Figure 2:
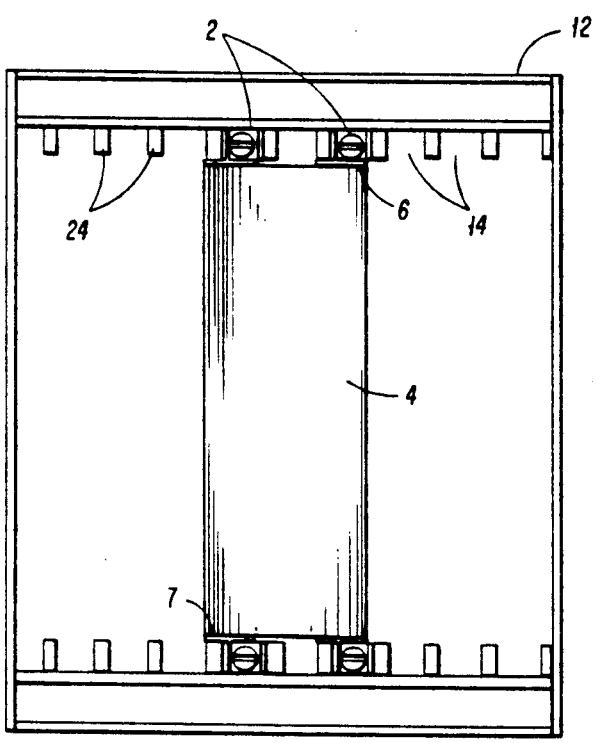
FIG. 2 is a front elevation of a rack having a module secured therein by a plurality of the invention.

FIG. 2 shows a module 4 mounted at top and bottom sides 6 and 7 respectively to a rack 12. Four of inventions 2 are shown mounted to module 4 and each invention 2 is received in a channel 14 formed between rails 24 of rack 12. Each invention 2 is shown in its expanded state wherein rails 24 are frictionally engaged by inventions 2 and each invention 2 is rigidly fixed upon side 6 or side 7 of module 4. In this Figure, module 4 is sufficiently wide to require two of invention 2 on each side thereof in order to provide sufficient stability for the mass of module 4 or to provide sufficient heat transfer routing for heat to be exhausted from module 4 to rack 12. Depending upon the mass of module 4 or its heat generation, more or fewer of invention 2 may be needed to retain module 4 securely to rack 12.

Figure 3:
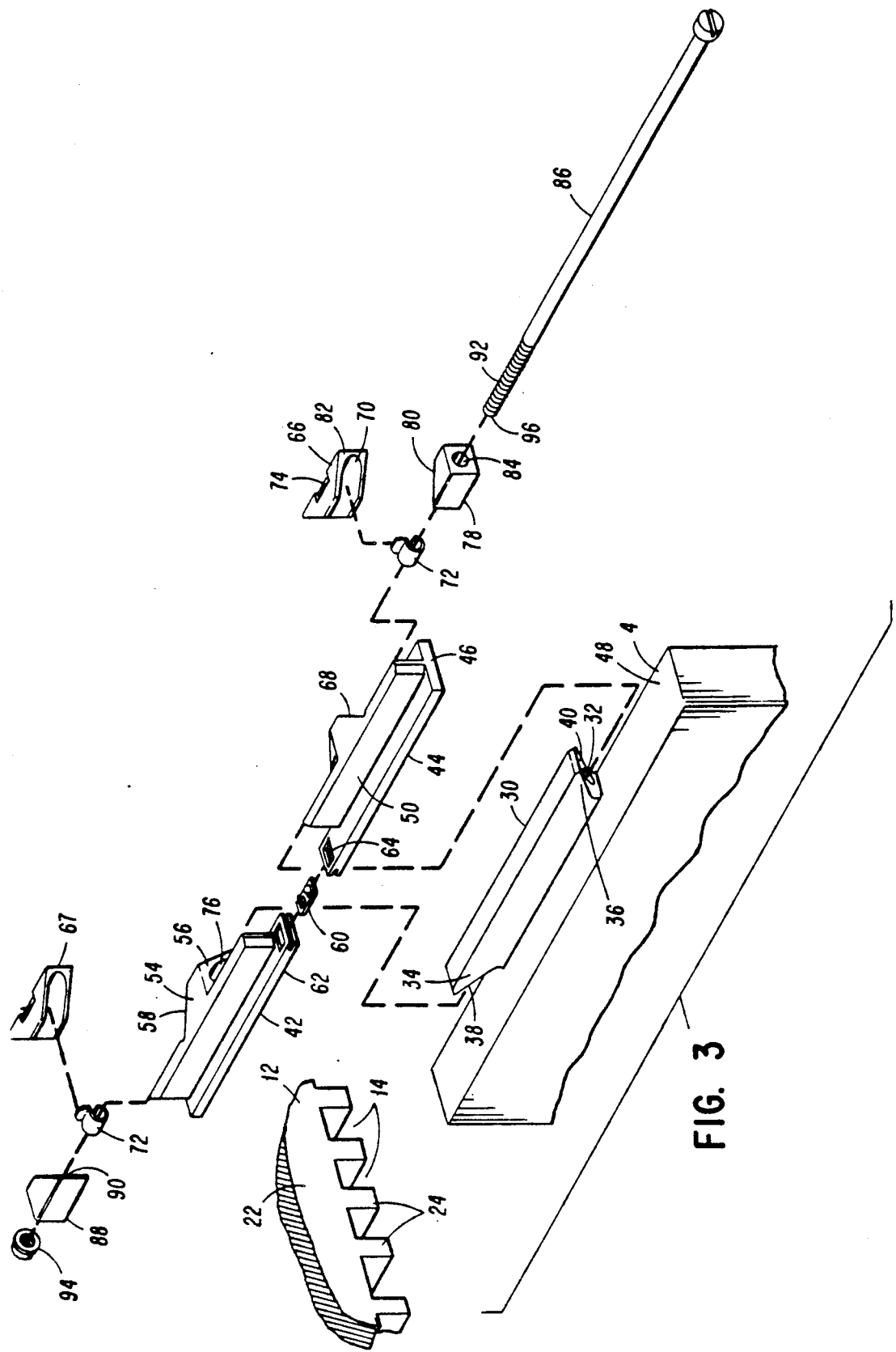
FIG. 3 is an exploded view in perspective of the preferred embodiment of the invention.

The components of invention 2 are disclosed in the exploded view of FIG. 3. A rib 30 is mounted to module 4 and engages and interacts with bracket members 42 and 44. A link 60 interconnects bracket members 42 and 44. Bracket member 42 is engaged by a first wedge member 67 and first wedge member 67 engages an engagement wedge 88.

The bracket member 44 is engaged by the first wedge member 66 which in turn is engaged by a second wedge 78. First wedge member 66 is generally identical to first wedge member 67 and similarly receives a spring 72 within its passageway 70.

A rod 86, which engages a jamming nut 94, interacts with each of the other elements of invention 2 by passing through passageways therein.

Referring further to FIG. 3, module 4 is depicted in a vertical configuration while rack 12, to which it may engage, is shown partially cut away. Rack 12 is provided with rails 24 along the top wall 22 thereof, the rails 24 defining channels 14 therebetween. In a typical airframe environment, channels 14 are precisely positioned at spaced apart distances and the widths of modules 4 are standardized in incremental widths. In some airframe applications, the width of module 4 is a multiple of 0.6 inch, for example. When module 4 is required to be increased in width, additional securing mechanisms are necessary to adequately secure the module to the rack for vibrational stability or heat transfer. Inventions 2 then may be used in multiple, generally parallel configurations, the inventions 2 being received in neighboring channels 14. If inventions 2 were permanently, immovably disposed upon module 4, as is the case with prior art devices, a tolerance buildup among the channels and clamps will result in a reduction of usefulness of the additional clamps; that is, after the first prior art clamp is in place, additional clamps may not fit properly in adjacent channels provided. However, the alignment characteristics of the instant invention 2 provide means to utilize the wedge clamps in multiples on the same module.

The rib 30 of invention 2 is mounted to module 4 and is provided with a passageway 32 axially therethrough. Rib 30 is provided with opposing ends 34 and 36 which comprise inclined surfaces 38 and 40 respectively which in turn interact with brackets 42 and 44 respectively. The brackets 42 and 44 are mirror images of each other and each includes an elongate base 46 which engages wall 48 of module 4. A ridge 50 depends from base 46 of bracket 44 and is generally perpendicular to base 46. When invention 2 is in its expanded state, base 46 of bracket 44 abuts and is frictionally retained to wall 48 of module 4 by forces exerted by inclined surface 40 of rib 30 interacting with bracket 44. By reference now to bracket 42 only, for clarity purposes, it can be seen that an enlarged region 54 is provided on bracket 42. The enlarged region 54 is provided with a first inclined surface 56 which is appropriately sloped to slidably abut inclined surface 38 of rib 30 when invention 2 is in its relaxed state. Enlarged region 54 also has a second inclined surface 58 positioned diametrically opposing inclined surface 56. The second inclined surface 58 defines a plane which is non-parallel to the plane defined by the first inclined surface 56 of bracket 42. A passageway 76 within enlarged region 54 of bracket 42 communicates with first inclined surface 56 and with second inclined surface 58 and is substantially coaxial with the passageway 32 of rib 30. Since brackets 42 and 44 are mirror images, bracket 44 is provided with identical elements as those of bracket 42, though in reverse configuration.

A link 60 flexibly joins brackets 42 and 44, thereby limiting the displacement between end 62 of bracket 42 and end 64 of bracket 44. Link 60 assists in captivation of brackets 42 and 44 to module 4. The wedge members 67 and 66 engage second inclined surfaces 58 and 68 of bracket members 42 and 44 respectively.

A passageway 70 passes through wedge member 66 and is provided with retracting spring 72 which affixes to a slot 74 of wedge member 66. The second wedge element 78 is provided with a slant wall 80 which is engageable with an inclined wall 82 of first wedge element 66. A bore 84 is provided through second wedge element 78 and receives a rod 86 which also passes through spring 72 of wedge member 66 and through a passageway of brackets 44 (not in view), through passageway 32 of rib 30 and through passageway 76 of enlarged region 56 of bracket 42. Rod 86 also passes through the spring 72 of other first wedge element 67.

The engagement wedge 88 is generally similar to second wedge 78 except that it is provided with a bore 90 with engaging means therein which engages the threads 92 of rod 86. The engagement wedge 88 interacts with first wedge element 67. A jamming nut 94 captures free end 96 of rod 86 to prevent retraction of rod 86 from invention 2 while allowing limited axial movement of rod 86 within the passageways of brackets 42 and 44, rib 30 and first wedge elements 66 and 67 and second wedge element 78 when invention 2 is in its relaxed state. Also, rod 86 is somewhat transversely displaceable within the elements of invention 2 except engagement wedge 88, when invention 2 is in its relaxed state. Selective rotation of rod 86 causes engagement of its threads 92 with the engaging means within bore 90 of engagement wedge 88.

When rod 86 is rotated to cause transition from the relaxed state of invention 2 to its expanded state, more of its threads 92 engage with the engaging means of bore 90 of engagement wedge 88. The interaction among brackets 42 and 44, rib 30, first wedge elements 66 and 67, second wedge element 78 and engagement wedge 88 causes the transverse displacement of first wedge elements 66 and 67 relative to the axis of rib 30. The ridges 50 of brackets 42 and 44 are urged against a rail 24 of rack 12 while first wedge elements 66 and 67 are urged against a neighboring rail 24. Also, when rod 86 is driven into engagement wedge 88, brackets 42 and 44 are urged against wall 48 of module 4, thereby fixing the lateral position of brackets 42 and 44 relative to wall 48.

Figure 4:
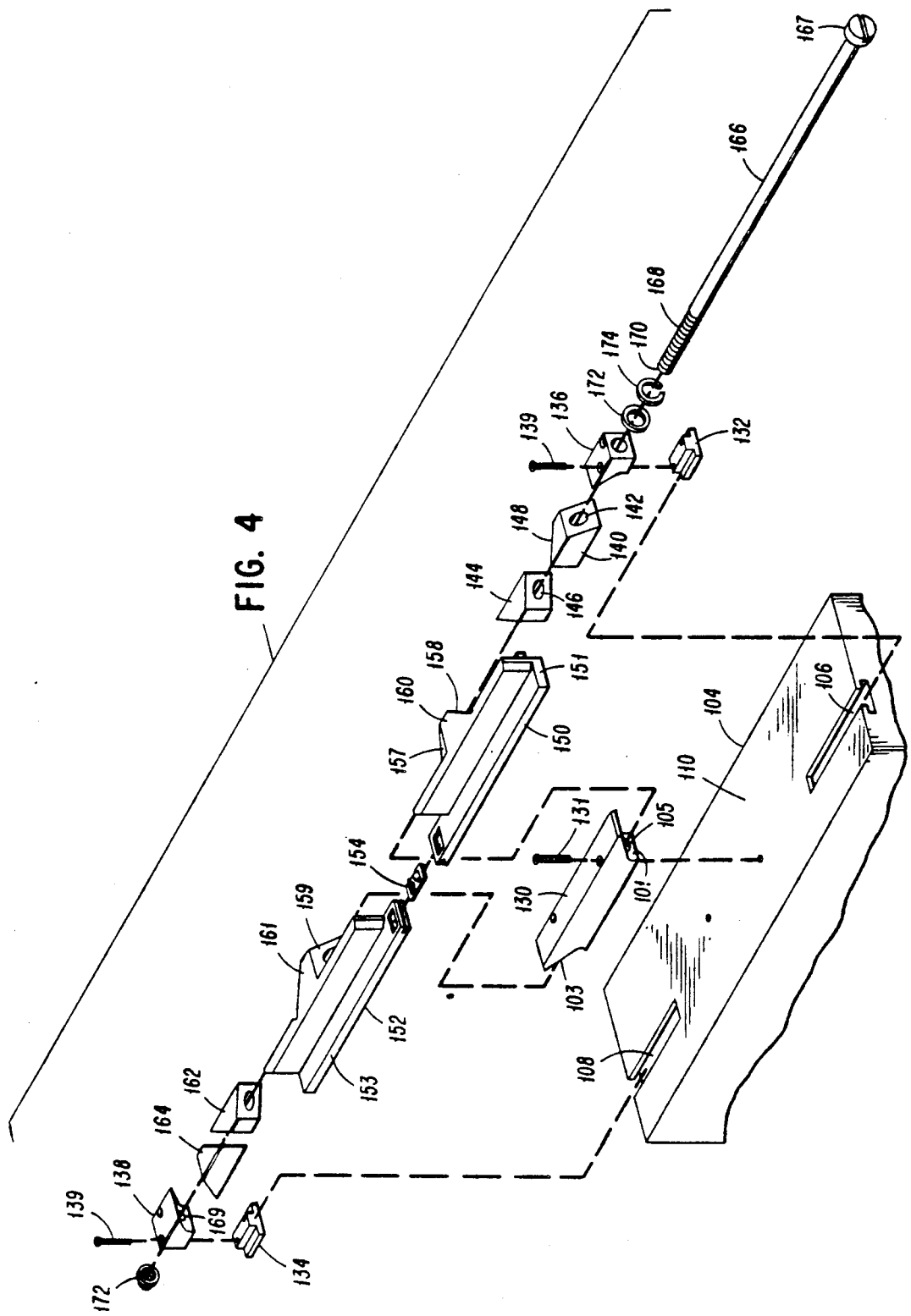
FIG. 4 is an exploded perspective view of an alternative embodiment of the invention.

An alternative embodiment of the invention is shown in FIG. 4. In this embodiment, the invention comprises a series of adjacently positioned elements including a rear wedge 138, a pair of first wedge elements 140 and 164, a pair of second wedge elements 144 and 162, a front wedge 136, and a pair of bracket elements 150 and 152. The bracket elements 150 and 152 are interactive with a rib 130 which is secured to the module 104 which is to be mounted to a rack. The wedge members are interactive with the bracket elements and with each other. A central passageway is formed through the elements in which a rod 166 is receivable. As seen in FIG. 4, module 104 is provided with slots 106 and 108 on the face 110 thereof, said face 110 having mounted thereto the rib member 130 by mounting means such as screw 131. Sliding plates 132 and 134 are receivable within slots 106 and 108 and have mounted respectively thereto the front wedge 136 and the rear wedge 138 by screws 139. The front wedge 136 engages first wedge element 140 at first sloped face 142 thereof. The first wedge element 140 engages second wedge element 144 at first sloped face 146 thereof. The first sloped face 146 of second wedge element 144 defines a plane which is non-parallel to that of first sloped face 142 of first wedge element 140. First wedge element 140 is provided with a second sloped face 148 which generally conforms in slope to first sloped face 146 of second wedge element 144. First bracket element 150 and second bracket element 152 are linked by a spring 154. Both first bracket element 150 and second bracket element 152 are slideable on face 110 of module 104 when the invention is not in its expanded state. The second wedge element 144 slidably abuts graduated face 158 of an enlarged region 160 of first bracket element 150 in a manner which will exert forces on second wedge element 144 transverse to the axis of bracket element 150.

First bracket element 150 and second bracket element 152 each engage rib 130 and are urged toward face 110 of module 104 when longitudinal forces are exerted on bracket elements 150 and 152 to direct them toward rib 130. Bracket elements 150 and 152 are substantially mirror images of each other.

Third wedge element 162 is substantially identical to second wedge element 144 and engages second bracket element 152 in a similar fashion to the manner that second wedge element 144 engages first bracket member 150.

Fourth wedge element 164 is substantially a mirror image of first wedge element 140 and operatively engages rear wedge 138 and third wedge element 162 in the same manner as first wedge element 140 engages front wedge 136 and second wedge 144.

The rod 166 is passable through each of front wedge 136, first wedge element 140, second wedge element 144, enlarged region 160 of first bracket element 150, rib 130, enlarged region 161 of second bracket element 152, third wedge element 162 and fourth wedge element 164. Flat washer 172 and lock washer 174 are received upon rod 166. The threads 168 of rod 166 engage threaded opening 169 of rear wedge 138 and are captured at end 170 of rod 166 by jamming nut 172. As torque is applied clockwise to head 167 of rod 166, threads 168 advance in engagement with the threaded hole 169, thereby shortening the effective length of the series of elements and thereby exerting forces to urge bracket elements 150 and 152 toward face 110 of module 104 by the impingement of the end faces 101 and 103 of rib 130 upon the inclined faces 157 and 159 of bracket elements 150 and 152 respectively, and further by the urging of first wedge element 140 upon base 151 of bracket member 150 caused by the force applied by front wedge 136 upon first sloped face 142 of first wedge element 140 and by the urging of fourth wedge element 164 upon base 153 of second bracket member 152 caused by the force applied by rear wedge 138 upon first wedge element 164.

As rod 166 is driven into rear wedge 138, the clamp moves toward its expanded state wherein wedge elements 144 and 162 are displaced transversely and enlarge the effective width of the invention clamp.

In the alternative embodiment of FIG. 4, when the invention clamp is in its relaxed state, it is free to move upon module 4 because the passageway 105 of rib 130 is larger in diameter than the diameter of rod 166. Additionally the passageway through the other elements except rear wedge 138 are oversized to allow transverse movement of those elements upon rod 166. As the module 104 is placed in a rack, the invention will align itself with the channel of the rack. After insertion within the channel, rod 166 is driven to engage its threads 168 with threaded hole 169 of near wedge 138. This compresses the elements, causing first wedge elements 162 and 144 to move transversely, thereby expanding the clamp against the rails defining the channels in the rack. Also as compression of the elements is effectuated, bracket elements 150 and 152 are forced against wall 110 of module 104 both by the effect of sloped end faces 101 and 103 and by the forces exerted by front wedge 136 on first sloped face 142 of first wedge element 140 and by rear wedge 138 upon first wedge 164. Sliding plates 132 and 134 self adjust in slots 106 and 108 as rod 166 is rotated. The invention thereby operates to expand in two dimensions, namely transversely within the channel of the rack, and by compression of the invention against the module.

Having described the invention, I claim:

1. A clamp for retaining a module to a rack having a channel extending thereinto, said clamp having a relaxed state and an expanded state, the invention comprising a rib mounted to said module, having a passageway therethrough and having inclined surfaces thereon, a pair of bracket members engaging said rib upon the inclined surfaces thereof, a pair of first wedge elements engaging said bracket members, a pair of second wedge elements engaging said first wedge elements, said first wedge elements and said bracket members engaging at inclined surfaces therebetween, said wedge elements and said bracket members each having passageways therethrough communicative with said passageway of said rib, a rod receivable within said passageways and axially movable therein, engaging means to engage said rod, said first wedge elements being displaceable transversely to the axis of said rib as said rod engages said engaging means.

said bracket members being urged orthogonally to said displacement of said first wedge elements as said rod engages said engaging means.

2. The invention of claim 1 wherein
said rib having said inclined surfaces at the ends thereof,
said inclined surfaces forming acute angles with said module.

3. The invention of claim 2 where
each of said bracket members slidable upon said module when said clamp is in its relaxed state,
each of said bracket members being frictionally fixed upon said module when said clamp is in its expanded state.

4. The invention of claim 1 wherein
each of said bracket members being a mirror image of the other.

5. The invention of claim 1 wherein
said bracket members being generally elongate having an enlarged portion therealong,
said passageways of said bracket members provided through said enlarged portions thereof,
said enlarged portion of each of said bracket members having a first sloped face thereon engageable with an inclined surface of said rib,
said enlarged portion of each of said bracket members having a second sloped face thereon engageable with one of said first wedge elements.

6. The invention of claim 5 wherein
said rod receivable in, in series, a first of said second wedge elements, a first of said first wedge elements, said enlarged portion of one of said bracket members, said rib, said enlarged portion of said other bracket member, the second of said first wedge elements, the second of said second wedge elements.

7. The invention of claim 6 wherein
said rod having threads upon one end thereof,
said second of said second wedge elements having threads upon the passageway therein,
said threads of said rod engaging said threads of said passageway of said second of said second wedge elements.

8. The invention of claim 1 wherein
said bracket members interlinked by a spring,
said spring urging said bracket members toward linear alignment.

9. A clamp for retaining a module to a rack having a channel extending thereinto on a side thereof, the invention comprising
a rib mounted on a side of said module, said rib having a longitudinal bore thereinto, said rib having an including surface at an end thereof, a bracket member interactive with said rib at the inclining surface thereof, a first wedge element interactive with said bracket member, a second wedge element interactive with said first wedge element, said bracket having a passageway therethrough generally coaxial with said bore of said rib.

said first wedge element and said second wedge element each being a passageway therethrough generally coaxial with said passageway of said bracket, a rod receivable within said passageways, said rod engageable with said bore of said rib, said first wedge element urged against said channel as said rod engages said bore of said rib.

10. The invention of claim 9 wherein
said bracket member having a first inclined surface thereon slidably engageable with said inclining surface of said rib,
said bracket member abutting said module proximal to the rib thereof.

11. The invention of claim 10 wherein
said bracket having a second inclining surface thereon non-parallel to said first inclining surface of said bracket,
said first wedge element having a pair of inclining surfaces thereon on opposing sides thereof,
one of said inclining surface of said first wedge element slidably engaging said second inclining surface of said bracket.

12. The invention of claim 11 wherein
said second wedge element having an inclining surface thereon,
said inclining surface of said second wedge element engaging said second inclining surface of said first wedge element.

13. The invention of claim 12 wherein
said rod being axially movable within said passageway when said rod is not fully engaged with said bore.

14. The invention of claim 9 wherein
said rod being radially movable within said passageways when said rod is not fully engaged with said bore.

15. The invention of claim 9 where
said bore of said rib having threading therein,
said rod having threads thereon,
said threads of said rod engageable with said threading of said bore of said rib.

16. The invention of claim 10 wherein
said engagement of said inclined surface of said rib with said first inclined surface of said bracket member urges said bracket member toward said module.

17. Apparatus for clamping a device to a rack having a longitudinal groove therein, comprising:
a rib on the device having a longitudinal channel therethrough and whose first and second end faces are oppositely sloped to form acute angles relative to the device;
a rod positioned in the longitudinal channel of the rib and having a retainer on one end and threads on the other end; and
a plurality of adjacently positioned sections having holes larger in diameter than said rod for receiving said rod therethrough and having a first set of complementary faces sloped with respect to a first dimension for allowing said sections to laterally expand in a first direction to engage the longitudinal groove in said rack and having a second set of faces sloped with respect to a second dimension non-parallel with said first dimension for allowing said sections to laterally expand in a second direction orthogonal to said first direction to simultaneously engage the sloped faces of said rib on said device and align itself with said rack.

18. The invention of claim 17 wherein
said two intermediate sections being flexibly linked.
19. The invention of claim 17 wherein
said sloped faces of said two intermediate sections engaging the faces of said rib in abutment.
20. The invention of claim 17 wherein
said two intermediate sections frictionally retained to said module when said rod is fully engaged with said engaging means.